United States Patent [19]
Chang et al.

[11] Patent Number: 5,894,437
[45] Date of Patent: Apr. 13, 1999

[54] CONCURRENT READ/WRITE ARCHITECTURE FOR A FLASH MEMORY

[75] Inventors: John Chang, Saratoga; Aaron Yip, Milpitas; Hsingya Arthur Wang, Saratoga; Farshid Shokouhi; Keone Streicher, both of Sunnyvale; Gianfranco Pellegrini, San Francisco, all of Calif.

[73] Assignee: Hyundai Elecronics America, Inc., San Jose, Calif.

[21] Appl. No.: 09/012,268

[22] Filed: Jan. 23, 1998

[51] Int. Cl.[6] .................................................. G11C 16/04
[52] U.S. Cl. ........................... 365/185.13; 365/185.06; 365/185.11
[58] Field of Search .................... 365/185.13, 185.05, 365/185.06, 185.11, 185.33

[56] References Cited

U.S. PATENT DOCUMENTS

| | | | |
|---|---|---|---|
| 4,970,685 | 11/1990 | Koyanagi | 365/51 |
| 5,126,808 | 6/1992 | Montalvo et al. | 365/185 |
| 5,448,518 | 9/1995 | Jinbo | 365/185.06 |
| 5,682,350 | 10/1997 | Lee et al. | 365/185.13 |
| 5,793,666 | 8/1998 | Yamazaki | 365/104 |

*Primary Examiner*—David Nelms
*Assistant Examiner*—Son Mai
*Attorney, Agent, or Firm*—Philip H. Albert; Townsend and Townsend and Crew

[57] ABSTRACT

A semiconductor device having an array of flash memory cells and for each column of cells, a global read bit line, a global write bit line, and a plurality of local bit lines, wherein the column of cells is divided into a plurality of subcolumns and each local bit line is electrically coupled to each of the cells in a subcolumn associated with the local bit line. The local bit line is coupled and decoupled to the global read bit line by a local read select transistor and is coupled and decoupled to the global write bit line by a local write select transistor. By coupling one local bit line for a column to the global read bit line and coupling another local bit line to the global write bit line, one cell can be written while another cell is read from, even though the cell being read and the cell being written are in the same column. A variation uses the two global bit lines as read lines or read/write lines instead of a global read bit line and a global write bit line for each column.

9 Claims, 2 Drawing Sheets

CONCURRENT READ/WRITE ARCHITECTURE FOR A FLASH MEMORY

BACKGROUND OF THE INVENTION

The present invention relates to the field of flash memory construction. More specifically, one embodiment of the present invention provides an improved method and apparatus for addressing flash memory cells.

Flash electrically erasable programmable read-only memory (EEPROM) has been an increasingly popular choice for memory systems architects because of the densities that can be achieved. For example, as much as sixteen megabytes of flash memory can be found on a single chip, such as the 29LV160 flash memory chip made by Hyundai Electronics America of San Jose, Calif. One feature of flash memories which allows such density is that each cell of the memory requires the use of only a single transistor. A cell is the unit of memory in which a bit is stored, or multiple bits in the case of multi-bit cells. As is well known in the art of flash memories, one or more bits can be stored as a charge on a floating gate interposed between a control gate and the source/channel/drain of the single transistor of a cell. Typically, a word line is connected to the control gates of each flash memory cell in a row of memory and a bit line is connected to the drains of each flash memory cell in a row of cells. The sources of each of the cells are coupled to a reference, typically ground; however, in some memories the connections for sources and drains are reversed.

To address a particular cell, a word line associated with the particular cell's row is activated to activate a row of the memory and a bit line associated with the particular cell's column is used to perform a memory operation. Multiple cells in a row can be operated on in parallel, using multiple bit lines. The memory operations performed on a selected cell or row of cells include reading the data stored in the cell or cells and programming, i.e., writing, a value or values to the cell or cells. Another memory operation, erasing, might also be performed on a particular cell, but more typically more than one row are erased at one time, hence the name "flash" memory. The term "sector" is used to describe a set of cells which are erased as a group in a flash memory. One disadvantage to this addressing scheme is that, when data is read from or written to the cell, the activity on the bit line may disturb the contents of cells in rows that have not been selected, as the bit line is coupled to many unselected cells in unselected rows in addition to a selected cell in the selected row. In flash memories where the drains of each cell are coupled to a bit line, this undesired effect is often referred to as a "drain disturb" effect.

In response to drain disturb and other concerns, some memory chips have been designed with a page architecture to reduce the ratio of unselected cells to selected cells on a given bit line. One example of this is shown in U.S. Pat. No. 5,126,808 (which is incorporated by reference herein for all purposes). That reference shows the division of the rows of a flash memory into a plurality of pages wherein a column of cells overlies a plurality of pages and a page bit line is provided for each column in each page. Using this approach, if one row is selected, only the page bit line for the page containing the selected row need be activated. This allows for the cells in other pages to remain undisturbed, as their page bit lines are not activated. This reduces the number of times an inactivated cell is disturbed, and consequently increases the number of times the memory can be accessed before drain disturb errors occur.

Another desire in flash memories is to increase the access speed. The apparatus shown in U.S. Pat. No. 5,126,808 may reduce the effects of drain disturb, but it does not provide for simultaneously accessing memory locations. Therefore, what is needed is an improved flash memory architecture which provides for improved access times.

SUMMARY OF THE INVENTION

An improved semiconductor device is provided by virtue of the present invention. In one embodiment, the semiconductor device is an array of flash memory cells having, for each column of cells, a global read bit line, a global write bit line, and a plurality of local bit lines, wherein the column of cells is divided into a plurality of subcolumns and each local bit line is electrically coupled to each of the cells in a subcolumn associated with the local bit line. The local bit line is coupled and decoupled to the global read bit line by a local read select transistor and is coupled and decoupled to the global write bit line by a local write select transistor. By coupling one local bit line for a column to the global read bit line and coupling another local bit line to the global write bit line, one cell can be written while another cell is read from, even though the cell being read and the cell being written are in the same column.

One advantage of the global read/write lines and local bit lines is improved memory array flexibility, as at least one read operation and at least one write operation for cells in the same column can be performed simultaneously. Another advantage is that drain disturbs due to read and/or write operations is reduced.

While the preferred embodiment uses a global read bit line and a global write bit line for each column to allow cells of one page to be written while cells of another page are read, an alternate embodiment might use the two global bit lines as read lines or read/write lines. In such embodiments, any two memory operations could be performed simultaneously.

A further understanding of the nature and advantages of the invention herein may be realized by reference to the remaining portion of the specification and the attached drawings.

DESCRIPTION OF THE PREFERRED EMBODIMENT

Figure 1:
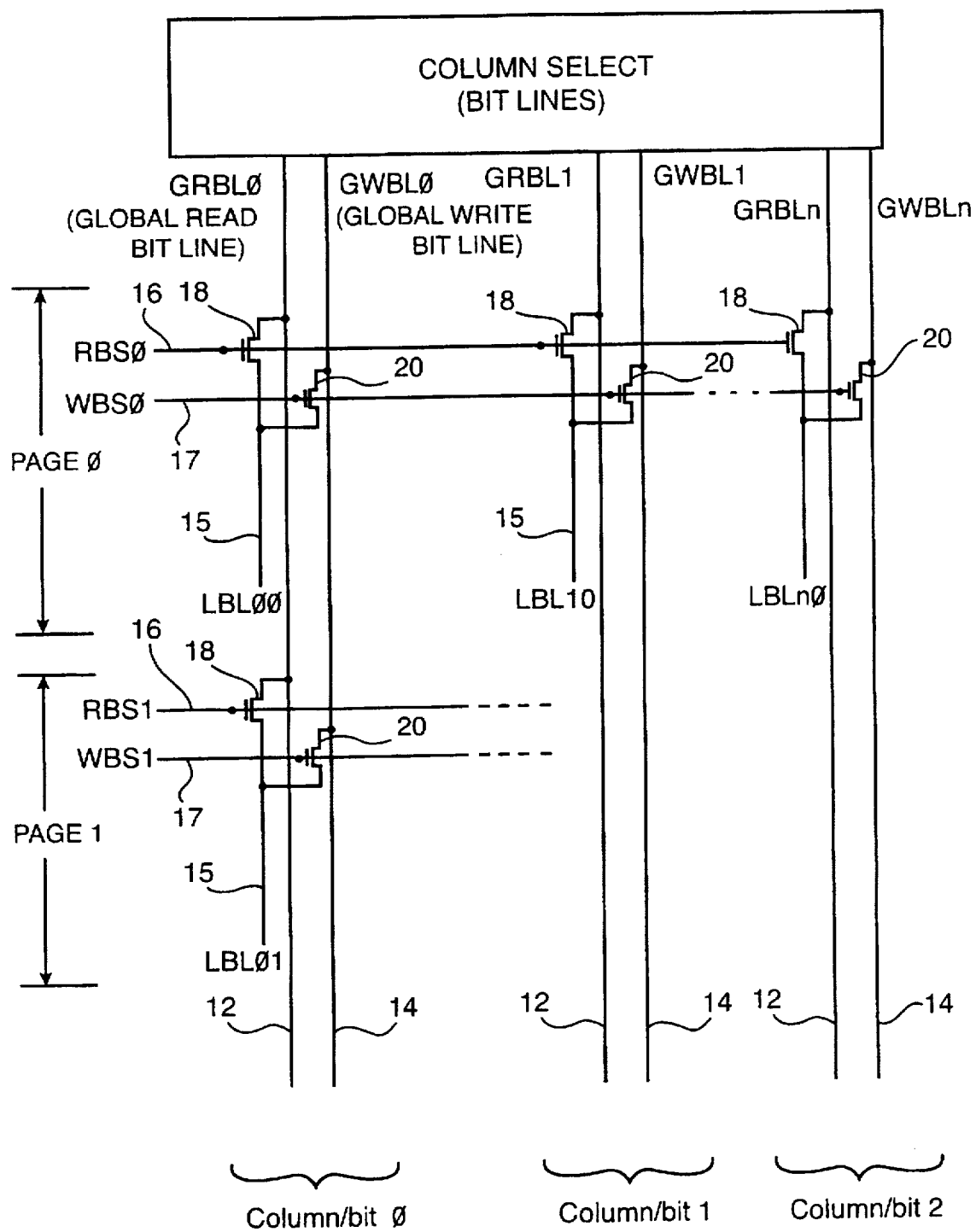
FIG. 1 is a schematic diagram showing select lines and select transistors of a flash memory.

FIG. 1 is a schematic of portions of a flash memory. Standard circuits of a flash memory are omitted for clarity. For example, word select and bit sense circuitry are omitted. The flash memory cells themselves are also omitted, but it should be understood that flash memory cells are arrayed in rows and columns, with each row being associated with a particular word select line and each column being associated with a particular bit line. As shown in FIG. 1, a global read bit line 12 and a global write bit line 14 are provided for each column (bit). For example, the global read bit line labeled "GRBL0" and the global write bit line labeled "GWBL0" are associated with each of the cells in column 0. The cells of column 0 (not shown) are divided into a plurality of pages. A local bit line 15 is provided for each subcolumn of cells, where a subcolumn is the portion of a column with a page. Several local bit lines are shown in FIG. 1. For example, the local bit line 15 labeled "LBL00" is the local bit line for the portion of the cells in column 0 which are in page 0, while the local bit line labeled "LBL01" is for the cells of column 0 which are in page 1. The local bit line for the cells in column 1 which are in page 0 is labeled "LBL10" and so on. A local bit line 15 is coupled to either a global read bit line 12 or a global write bit line 14 in response to signals on a read bit select line 16 or a write bit select line 17. As shown, read bit select line 16 is coupled to the gate of each of a plurality of read select transistors 18. Each local bit line 15 can also be coupled to its associated global write bit line 14 by turning on a write select transistor 20 using a write bit select signal on write bit select line 17. In the preferred embodiment, at most one of the global bit lines is coupled to the local bit line at a time.

The number of cells in each column, row and subcolumn depends on the architecture of the chip. In an industry standard known as a "bootsector" arrangement, the chip is divided in 64 kilobyte sectors except for the last 64 kilobytes of the chip, which are divided into a 32 kilobyte sector, two eight kilobyte sectors and a sixteen kilobyte sector. In a typical case, the page boundaries are the same as the sector boundaries, but that need not be the case. Of course, where it is desired to have a simultaneous read from one location in a sector and a write to another location in that same sector, that sector would be divided into multiple pages. For example, a 64 kilobyte (512 kilobit) sector might be divided into 1024 512-bit pages.

Figure 2:
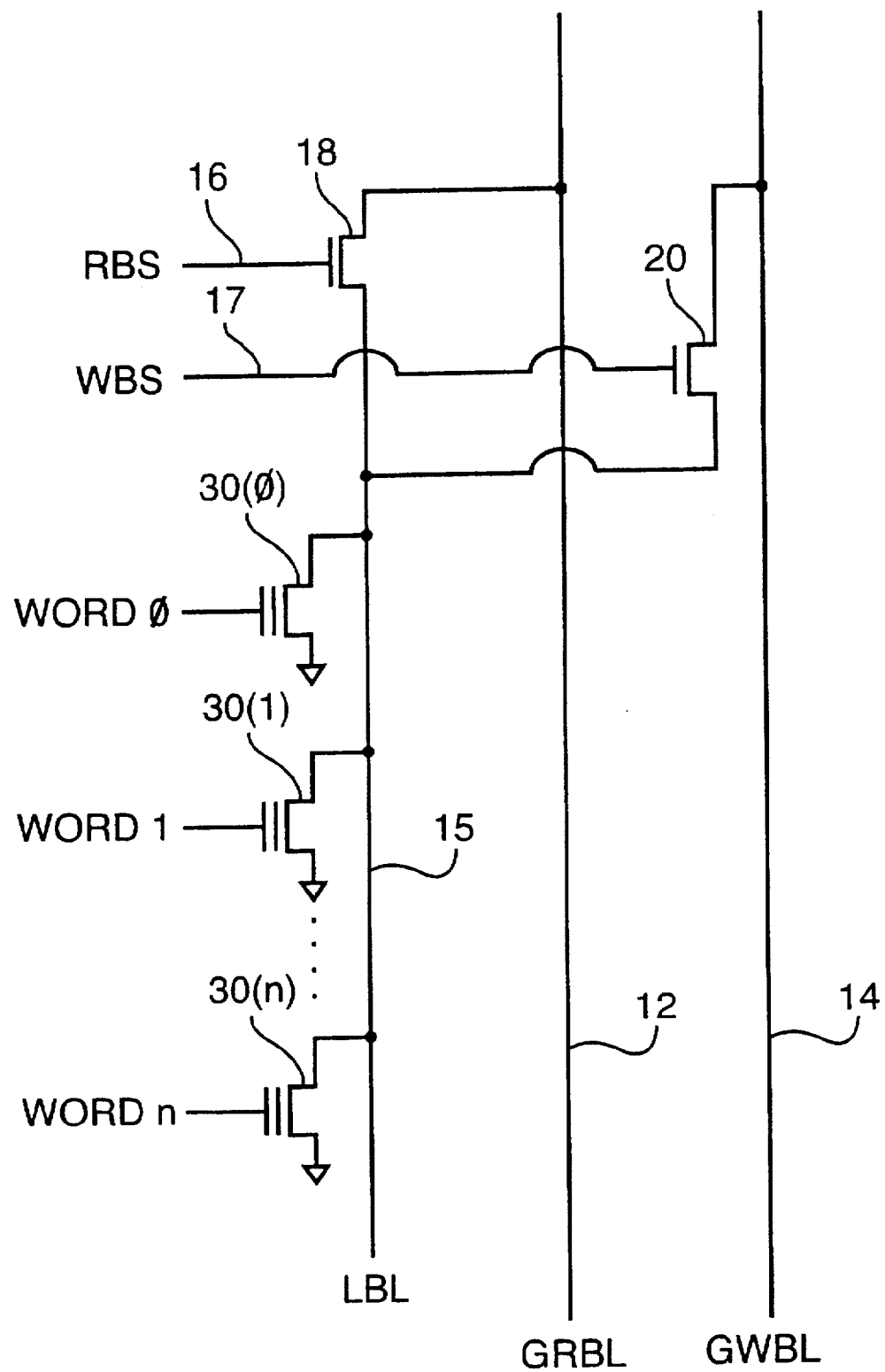
FIG. 2 is a more detailed schematic showing the interconnections between global bit lines, a local bit line and flash memory cells.

Referring now to FIG. 2, the interconnections of various elements shown in FIG. 1 are shown in greater detail. FIG. 2 shows only one local bit line 15, although it should be understood that a typical flash memory would have several local bit lines 15 which could be coupled to a particular global read bit line 12 or a particular global read bit line 14 and that a typical memory would have multiple pairs of global bit lines. In other words, a typical flash memory would include the circuitry shown in FIG. 2 as well as many copies of the circuitry shown in FIG. 2 with as many copies arrayed top to bottom as there are pages in the flash memory and as many copies arrayed from left to right as there are bits in the flash memory. Thus, FIG. 2 merely illustrates one subcolumn of a memory having multiple columns each of which comprise multiple subcolumns.

FIG. 2 shows only three flash memory cells 30, but it should be understood that a typical flash memory would have more cells per subcolumn. One reason to have more cells per subcolumn is that select transistors 18 and 20 require additional chip area, and with more flash memory cells 30 per subcolumn, the penalty per bit is reduced. Each of the control gates of flash memory cells 30 is coupled to a word select line (WORD0, WORD1, . . . , WORDn), as is done in a conventional memory.

The operation of a flash memory as shown in FIGS. 1 and 2 will now be described. The following description arbitrarily uses flash memory cell 30(1) as an example. To read the contents of flash memory cell 30(1), word select line WORD1 is activated while the other word select lines are deactivated, as is well known in the art of word selection in flash memories. Read bit select line 16 is driven high to turn on read select transistor 18, thereby coupling local bit line 15 to global read bit line 12. Although the process has been described with the word line being selected prior to the read bit line being selected, under certain conditions these steps could be done in reverse order.

While the word select line for cell 30(1) is activated and local bit line 15 is coupled to global read bit line 12, the cell is read in a conventional manner, such as connecting global read bit line 12 to a bit sense amp. During this process write bit select line 17 is held low to keep write select transistor 20 off. Also, during this time the read select lines and write select lines for each of the other pages are kept low so that the local bit lines 15 for each of the other pages are isolated from the global bit lines.

For a write operation, the word select lines are as before, but the read bit select line 16 is held low to keep read select transistor 18 off and write bit select line 17 is driven high to turn on right select transistor 20.

Although FIGS. 1 and 2 show the read and write select transistors as being NMOS (active high) devices, PMOS devices might be used instead with the appropriate changes in signal level and biasing as should be apparent after reading the present specification.

FIGS. 1 and 2 show two global bit lines per column with one being a global read bit line and the other being a global write bit line. One variation of the above-described flash memory also has two global bit lines per column, but each global bit line is not limited to a specific function. For example (referring now to FIG. 1), a first global bit line and a second global bit line could be substituted for GRBL0 and GWBL0. This would allow the cells in column 0 and page 1 to be read using global bit line 1 while the cells in column 1 which are in page 1 can be simultaneously read using global bit line 1. This can increase overall memory access speed.

The above description is illustrative and not restrictive. Many variations of the invention will become apparent to those of skill in the art upon review of this disclosure. For example, the present invention can be used in a NAND cell memory as well as a NOR cell memory, and can be used in chips with uneven sectors or chips with only one sector size. The scope of the invention should, therefore, be determined not with reference to the above description, but instead should be determined with reference to the appended claims along with their full scope of equivalents.

What is claimed is:

1. A semiconductor device comprising an array of flash memory cells, wherein the flash memory cells of the array are arranged, either logically or physically, into rows of cells and columns of cells, wherein each cell comprises a bit signal node for receiving a bit signal, the semiconductor device comprising:

a global read bit line;

a global write bit line;

a plurality of local bit lines, wherein a column of cells comprises a plurality of subcolumns of cells and each local bit line is electrically coupled to bit signal nodes of one of the subcolumns of cells; and for each local bit line:

(a) read select means for coupling the local bit line to the global read bit line; and (b) write select means for coupling the local bit line to the global write bit line.

2. The semiconductor device of claim 1, further comprising column control logic for performing a first memory operation on a first subcolumn in a column while performing a second memory operation on a second subcolumn of the column.

3. The semiconductor device of claim 2, wherein the first memory operation and the second memory operation are selected from reading and programming.

4. The semiconductor device of claim 2, wherein the first memory operation and the second memory operation are selected from reading, programming and erasing.

5. The semiconductor device of claim 2, wherein the first memory operation and the second memory operation are selected from reading and programming and the first memory operation is different from the second memory operation.

6. The semiconductor device of claim 1, further comprising a plurality of columns of cells, each comprising a plurality of subcolumns, a global read bit line and a global write bit line and each subcolumn comprising a local bit line, read select means for coupling the local bit line to the global read bit line of the subcolumn's column and write select means for coupling the local bit line to the global write bit line of the subcolumn's column.

7. The semiconductor device of claim 1, wherein each cell comprises a word signal node for receiving a word signal, the semiconductor device further comprising a plurality of word lines, wherein each row of the rows of cells has an associated word line of the plurality of word lines which associated word line is electrically coupled to the word signal nodes of each cell in its associated row of cells.

8. A semiconductor device comprising an array of flash memory cells, wherein the flash memory cells of the array are arranged, either logically or physically, into rows of cells and columns of cells, wherein each cell comprises a bit signal node for receiving a bit signal, the semiconductor device comprising:

a first global bit line;

a second global bit line;

a plurality of local bit lines, wherein a column of cells comprises a plurality of subcolumns of cells and each local bit line is electrically coupled to bit signal nodes of one of the subcolumns of cells; and for each local bit line:
 (a) first select means for coupling the local bit line to the first global bit line; and
 (b) second select means for coupling the local bit line to the second global bit line.

9. The semiconductor device of claim 8, further comprising column control logic for performing a first memory operation on a first subcolumn in a column while performing a second memory operation on a second subcolumn of the column.

* * * * *